United States Patent [19]

Joshi et al.

[11] 3,728,592

[45] Apr. 17, 1973

[54] SEMICONDUCTOR STRUCTURE HAVING REDUCED CARRIER LIFETIME

[75] Inventors: Madhukar Laxman Joshi, Essex Junction, Vt.; Burton Joseph Masters, Poughkeepsie, N.Y.; Osvaldo Raul Viva, Williston, Vt.; Tsu-Hsing Yeh, Poughkeepsie, N.Y.

[73] Assignee: International Business Machines Corporation, Armonk, N.Y.

[22] Filed: Sept. 14, 1971

[21] Appl. No.: 180,488

Related U.S. Application Data

[62] Division of Ser. No. 823,255, May 9, 1969, Pat. No. 3,625,781.

[52] U.S. Cl....317/235 R, 317/235 AQ, 317/235 AN, 317/235 AM

[51] Int. Cl...........H01l 7/44, H01l 9/12, H01l 19/00

[58] Field of Search.................317/235 AQ, 235 AN

[56] References Cited

UNITED STATES PATENTS

| | | | |
|---|---|---|---|
| 3,473,976 | 10/1969 | Captrucci | 148/175 |
| 3,602,779 | 8/1971 | Chapron | 317/235 R |
| 3,617,398 | 11/1971 | Bilona | 148/175 |
| 3,445,736 | 5/1969 | Navon | 317/235 |

*Primary Examiner*—Martin H. Edlow
*Attorney*—Hanfin and Jancin

[57] ABSTRACT

A method of fabricating high-speed planar transistor structures by reducing carrier lifetime through doping with carrier lifetime killers. Gold is diffused through the front surface of the silicon structure during transistor fabrication. The gold is introduced from the vapor phase in a controlled manner so that its solid solubility in silicon is not exceeded. A simultaneous gold and base diffusion is preferred.

Such a simultaneous diffusion produces a novel planar transistor structure having a gold distribution curve with an unexpected increased concentration peak in the region proximate to the base-collector junction.

8 Claims, 6 Drawing Figures

SEMICONDUCTOR STRUCTURE HAVING REDUCED CARRIER LIFETIME

This application is a division of Ser. No. 823,255 filed May 9, 1969, now U.S. Pat. No. 3625781.

BACKGROUND OF THE INVENTION

1. Field of the Invention

The present invention relates to an improved method of forming high-speed planar transistors wherein carrier-lifetime!-killer doping is rendered more effective.

2. Description of the Prior Art

Recent trends in the semiconductor art have been in the direction of miniaturization of semiconductor device structures to achieve higher operating speeds, lower cost of fabrication, and greater component reliability. Some of these miniature semiconductor devices are integrated by fabricating the devices in a single substrate of the same material as the semiconductor devices. Other integrated fabrication techniques form a number of integrated semiconductor devices on a support structure of substrate of any desired material. These fabrication techniques are being extensively developed in order to permit the utilization of semiconductor device components in large and complex electronic equipment, such as computers, for higher speed operation. However, the most essential factor in the production of monolithic integrated semiconductor structures is to have a high manufacturing yield and therefore, a low-cost fabrication process.

In the past, it was well known in the semiconductor manufacturing art to dope semiconductor structures with carrier lifetime killers, such as gold, platinum, etc., in order to reduce carrier lifetime. These carrier-lifetime-killing -killing impurities formed recombination regions in the semiconductor body, thereby decreasing the lifetimes of the carriers to permit either fast transistor switching operations or quick turn off. However, it was discovered that in using carrier lifetime killers, channels or "pipes" were somehow formed between regions of the same conductivity type, particularly between the diffused emitter and the collector regions of planar transistors, thereby shorting out these two regions and destroying the operation of the transistor devices. In the fabrication of a great multiplicity of discrete or individual transistor devices in a single semiconductor wafer (i.e., 1,100 devices in a wafer), it was not essential that this "pipe" formation phenomena be controlled due to the fact that if some of the devices were inoperable because of the formation of "pipes," there were still a sufficient number of discrete devices available for use, and the resultant loss in yield, though significant, did not become critical.

However, in the formation of monolithic integrated semiconductor structures wherein a multiplicity of active (transistors, diodes, etc.) and passive (resistors, capacitors, etc.) devices were fabricated in a single mono-crystalline semiconductor body and interconnected to form individual chips having hundreds of components, it became extremely critical to control the formation of "pipes," since a single shorting "pipe" formed in a densely populated, integrated chip structure would destroy not only the operation of the individual device where the pipe was formed but, in addition, would destroy or render inoperative the entire monolithic structure. The yield in producing monolithic integrated structures without solution of this "pipe" problem was approximately zero percent.

In accordance with conventional practice, the gold to be diffused into the transistor or integrated circuit containing the transistor is plated on the backside of the substrate or wafer in which the transistor is being formed. Gold from this source diffuses into and through the wafer during subsequent fabrication steps, such as diffusions and oxidations, which require heating. It should be noted that the transistors in most standard integrated circuits are planar transistors, i.e., they are formed by means of base and emitter diffusions through the front surface of the wafer; thus, emitter, base, and collector regions extend from this common front surface. In the fabrication of such a transistor, gold is diffused from the backside because the plating of gold on the front of the wafer would interfere with subsequent oxidation and/or diffusion operations. The gold backside layer may be customarily formed at various stages of transistor fabrication by removing a portion of the oxide from the back of the wafer by mechanical means, such as sand blasting, and then plating out evaporated gold onto the backside of the surface of the wafer.

We have observed that in planar transistor structures having gold diffused from such an infinite backside source, there is a tendency towards regions of precipitated gold throughout the wafer and particularly towards the front region of the wafer wherein the emitter, and base are located. The gold appears to precipitate out along dislocations in the semiconductor material. We believe that it is the gold precipitated along these dislocations which is responsible for the problem of "pipe" formation.

SUMMARY OF THE INVENTION

Accordingly, it is the primary object of the present invention to provide a method of forming a high-speed planar transistor doped with carrier lifetime killers in which "pipe" formation is minimized.

It is another object of this invention to provide such a method for minimizing "pipe" formation in monolithic integrated semiconductor structures doped with carrier lifetime killers.

It is a further object of this invention to provide a method of introducing carrier lifetime killers into planar transistor structures which is more efficient and eliminates processing steps.

It is yet a further object of this invention to provide an improved planar transistor structure doped with carrier lifetime killers.

It is still another object of this invention to provide an improved planar monolithic integrated semiconductor structure doped with carrier lifetime killers.

It is even another object of this invention to provide a planar transistor structure having enhanced switching speed with minimal "pipe" formation.

It is another object of this invention to provide a method of selectively introducing gold into limited surface areas of planar integrated circuits to selectively dope only specific devices and elements in said circuits.

In accordance with the present invention, gold or other carrier lifetime killers are diffused directly from the vapor phase into the planar transistor structure being formed through the front surface of the wafer. The vapor at said front surface has a gold concentration below that capable of producing a gold concentration in excess of the solid solubility of gold in the semiconductor material. We have found that by diffusing the gold from the vapor phase in this manner, precipitation of gold within the transistor, as well as "-pipe" formation, is minimized.

Without being bound to the theory involved, it is believed that in the diffusion of gold in accordance with the method of this invention, the concentration of gold in the transistor does not exceed the solid solubility of gold in the semiconductor material, e.g., silicon. Because the concentration is below the solid solubility point, the gold dopant does not precipitate. It has been found that the gold can conveniently be diffused through holes opened in the oxide masking layer for other purposes, such as emitter diffusion, base diffusion, or metallic contacts. One manifest advantage of this approach is the elimination of additional processing steps, such as sand blasting, to remove backside oxide and gold plating which are required in conventional gold diffusion methods. In addition, the gold diffusion from the vapor phase may be carried out simultaneously with the base or emitter diffusions, thereby eliminating even further processing steps.

It has been found to be particularly advantageous to carry out the gold diffusion simultaneously with the base diffusion. Such a simultaneous diffusion method, particularly a closed-type diffusion, may be utilized to produce a unique gold concentration profile relative to the distance from the planar transistor surface. The profile which will be described in greater detail hereinafter indicates a surprising peak or increase in gold concentration in the region proximate the collector-intrinsic base junction. The intrinsic base is that portion of the base underlying the emitter. This increased gold concentration is in a region where gold may be very effectively utilized to kill minority carriers and thus increase the switching speed of the collector-base junction.

The vapor phase diffusion technique of the present invention makes it possible to tailor gold concentration profiles toward particular needs by the ability to control the concentration of gold brought into contact with the planar transistor. Such tailoring was not practical in the prior art methods utilizing a plated deposit which was, in effect, an infinite source.

In addition, the vapor phase diffusion through the front surface of the planar structure makes possible the selective doping of specific devices and elements in integrated circuits without doping other devices with gold. To illustrate, if we intended to dope the transistors in the integrated circuits with gold while minimizing any attendant gold doping in resistors or diodes in the circuit, then, the gold would be introduced through the front surface while resistors and diodes were masked, e.g., during or after emitter diffusion through emitter holes. Such selective gold diffusion was not possible with the prior art backside diffusion methods.

The foregoing and other objects, features and advantages of the invention will be apparent from the following more particular description and preferred embodiments of the invention as illustrated in the accompanying drawings.

DESCRIPTION OF THE PREFERRED EMBODIMENTS

A typical embodiment of the present invention wherein gold is diffused through the front surface of the planar structure being formed is described with reference to FIG. 1. In discussing the fabrication method, the usual terminology that is well known in the transistor field will be used. In discussing concentrations, references will be made to carriers. By "carriers" is signified the free-holes or electrons which are responsible for the passage of current through a semiconductor material. Majority carriers are used in reference to those carriers in the material under discussion, i.e., holes in P-type material or electrons in N-type material. The terminology "minority carriers" is intended to signify those carriers in the minority, i.e., holes in N-type material or electrons in P-type material. In the most common type of semiconductor materials used in present day transistor structure, carrier concentration is generally due to the concentration of the "significant impurity," that is, impurities which impart conductivity characteristics to extrinsic semiconductor materials.

Although for the purpose of describing this invention reference is made to a semiconductor configuration wherein a $P^-$-type region is utilized as the substrate and subsequent semiconductor regions of the composite semiconductor structure are formed in the conductivity types described, it is readily apparent that the same regions that are referred to as being of one conductivity type can be of the opposite type conductivity and furthermore, some of the operations which are described as diffusion operations can be made by epitaxial growth and some of the epitaxial growth regions can also be fabricated by diffusion techniques.

Figure 1:
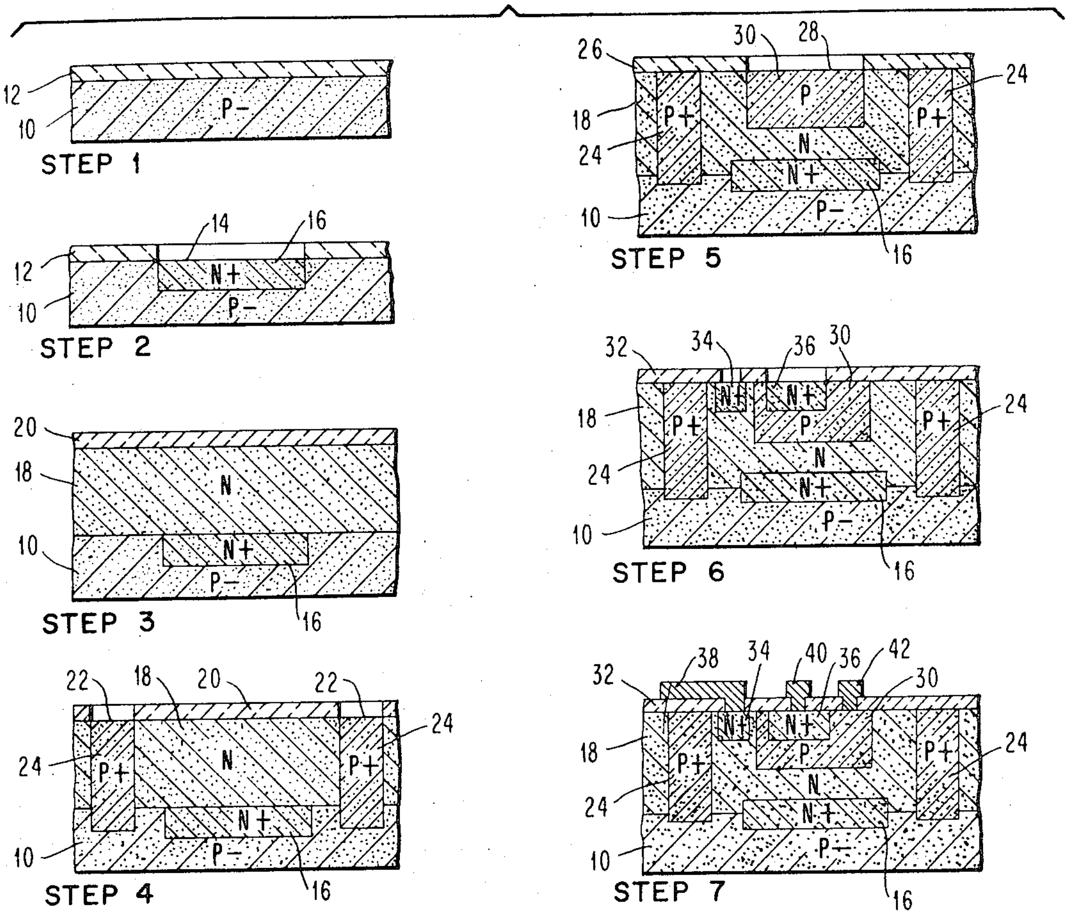
FIG. 1 is a flow diagram, in cross-section, illustrating the fabrication method of the present invention with respect to a single transistor which may be part of a monolithic integrated circuit.

Referring to FIG. 1, step 1 depicts a substrate 10 of $P^-$-type conductivity, preferably having a resistivity of 10 to 20 ohms-centimeter. The substrate 10 is preferably a monocrystalline silicon structure which can be fabricated by conventional techniques, such as by pulling a silicon semiconductor member from a melt containing the desired impurity concentration and then slicing the pulled member into a plurality of wafers. The substrate 10 is a portion of one such wafer. An oxide coating 12, preferably of silicon dioxide and having a thickness of about 5,000 Angstrom units, is either thermally grown or deposited by pyrolytic deposition. Alternatively, an RF sputtering technique, as described in U.S. Pat. No. 3,369,991, can be used to form the silicon dioxide layer 12.

In step 2, by standard photolithographic masking and etching techniques, a photo-resist layer (not shown) is deposited onto the substrate including the surface of the oxide layer 12 and by using the photo-resist layer as a mask, a surface region 14 is exposed on the surface of the substrate 10 by etching away the desired portion of the $SiO_2$ layer 12 with a buffered HF solution. The photoresist layer is then removed to permit further processing. A diffusion operation is carried out to diffuse into the surface 14 of the substrate 10 an $N^+$-type region 16 having a $C_o$ of $2 \times 10^{20}$ $cm^{-3}$ of N-type majority carriers. The oxide layer 12 serves as a mask to prevent the $N^+$ region 16 from being formed across the entire surface of the substrate 10. Preferably, the diffusion operation is carried out in an evacuated quartz capsule using degenerate-arsenic-doped silicon powder. As an alternative variation, the $N^+$ region 16 can be formed by etching out a channel in the $P^-$ type substrate 10 and then subsequently epitaxially growing an $N^+$ region.

In step 3, after removing the oxide layer 12 with a buffered HF solution, a region 18 of N-type conductivity, preferably having a resistivity of 0.5 ohms per centimeter, is epitaxially grown on the surface of the substrate. The epitaxial region 18 is an arsenic-doped layer approximately 5.5 to 6.5 microns thick. In actual device fabrication, the arsenic impurities in the region 16, which are not buried, outdiffuse about 1 micron during the epitaxial deposition. An oxide layer 20, approximately 5,200 angstrom units thick, is formed on the surface of the epitaxially grown region 18 either by the thermal oxidation process, by pyrolytic deposition, or by RF sputtering techniques.

In step 4, a continuous opening 22 is formed in the oxide layer by standard photolithographic masking and etching techniques using a photo-resist layer as a mask, and a buffered HF solution to remove the desired oxide portions. The structure is now prepared for the subsequent isolation diffusion operation. A $P^+$ diffusion is now carried out, preferably using a boron source, to form surrounding region 24 in the N-type epitaxially grown region 18. This diffusion operation is carried out at a temperature of 1,200°C for a period of 95 minutes forming a $C_o$ (surface concentration) of $5 \times 10^{20}$ $cm^{-3}$. It is evident that the $P^+$ isolation diffused region 24 will have a low-resistivity surface region which extends downwardly from the surface of the semiconductor structure and the full isolation region extends continuously from the P-type substrate region 10 to the surface of the semiconductor structure.

Figure 2:
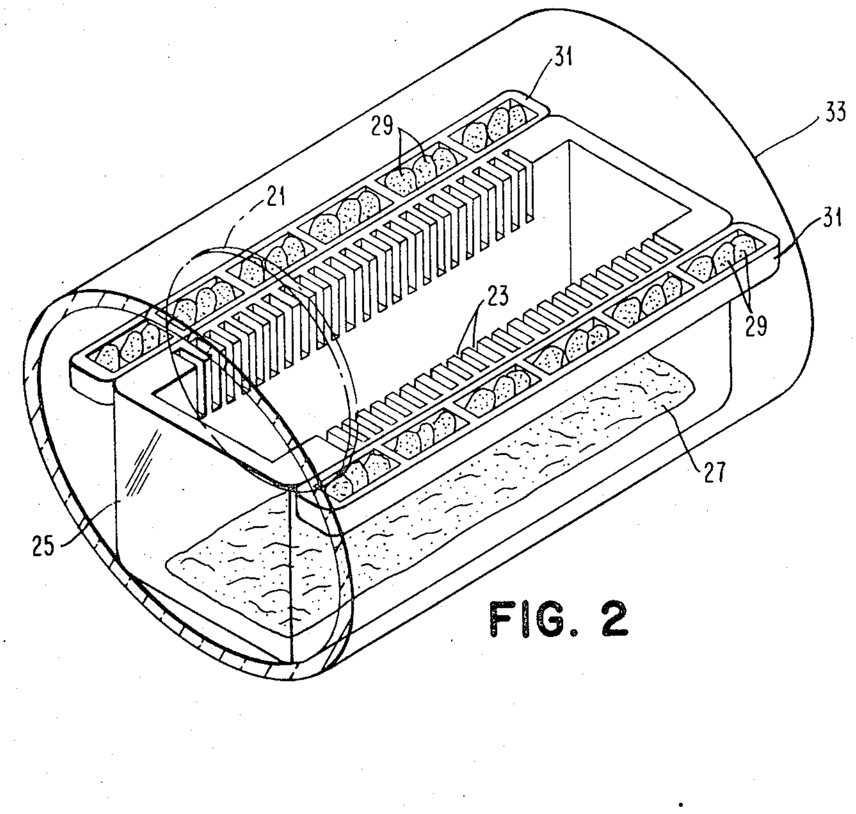
FIG. 2 is a diagram of the apparatus used in the gold diffusion step of the preferred embodiment of the present invention.

Next, as shown in step 5, the gold is diffused from the vapor state into the wafer through front surface 28. In the present embodiment, this is done simultaneously with the diffusion of base region 30. An oxide layer 26 preferably is thermally grown on the semiconductor surface. By using photolithographic masking and etching techniques, a hole is opened up in oxide layer 26 above the isolated N-type region 18 so as to permit the base diffusion. The simultaneous base and gold diffusion operation is carried out utilizing the closed-tube arrangement shown in FIG. 2. Wafers 21 are supported upright in recesses 23 of quartz boat 25. The impurity source, boron, 27 is located at the base of the boat. Gold pellets 29 are supported on flanges 31 of the boat. The boat is enclosed within capsule 33. The closed capsule is subjected to a temperature of 1,108°C for a period of 35 minutes. The resulting base region 30 has a boron surface concentration of $5 \times 10^{19}$ $cm^{-3}$.

In step 6, the base diffusion step is followed by a simultaneous reoxidation and drive-in operation. Another layer 32 of $SiO_2$ is thereby grown, having a thickness of about 3600 Angstrom units. During this heat treatment, the boron impurities are redistributed, thereby increasing the junction depth and lowering the $C_o$. The oxidation drive-in cycle is 25 minutes in $N_2$, 5 minutes in dry $O_2$ and 15 minutes in steam, followed by 5 minutes in dry $O_2$ at 1,150°C.

A photo-resist coating is applied over the oxide layer 32 and by photolithographic masking and etching operations, two portions of this oxide layer are removed to permit emitter-type regions to be formed by a diffusion operation. One $N^+$ emitter-type region 34 is formed in the N-type collector region 18 to provide a good electrical contact region. An $N^+$ emitter region 36 is also formed in the base region 30.

The N-type emitter regions are formed in the P-type base regions using preferably a phosphorous impurity source, such as $POCl_3$, and heating the wafer in an atmosphere containing 700 parts per million of $POCl_3$ at a temperature of 970°C and for a period of 35 minutes. Preferably, the emitter and base regions are formed over the buried $N^+$ region to permit this region to act as a buried low-resistivity subcollector.

Next, a final oxidation and emitter drive-in operation is performed, using a 5 minute-dry $O_p$, a 55 minute steam cycle followed by an 85 minute-dry $O_2$ heat treatment at about 970°C. During this heat treatment operation, the final oxide layer is formed over the front surface. The concentration of the gold in the wafer is shown by the profile in the graph of FIG. 3B.

A layer of aluminum is then evaporated over the entire wafer surface and portions of this layer are etched away to produce the desired interconnection pattern. The evaporated layer of aluminum has a thickness of 6000 Angstrom units. A layer of photo-resist is then applied to the wafer, dried, exposed, developed, and fixed. The aluminum interconnections are formed by a subtractive etching operation using a warm solution of $H_3PO_4 + HNO_3 + H_2O$. The photo-resist layer is stripped off and the wafer is cleaned and dried. The wafers are sintered in a nitrogen atmosphere at 450°C for 15 minutes to permit the aluminum to produce good ohmic contacts to the contacted semiconductor regions of the wafer, as shown in step 7. Ohmic contacts 38, 40 and 42 provide electrical connection to the collector 18, emitter 36 and base regions, respectively.

In order to compare the planar transistor structure produced as described above, a structure is prepared utilizing conventional gold diffusion steps. In the preparation of this structure, steps 1 through 4 of FIG. 1 are carried out in the same manner. However, in step 5, only a boron diffusion to form the base is made. The gold is then introduced by sand blasting the back of the substrate to remove any oxide which might have been present, after which gold is plated onto the back surface at a thickness of 200 in the conventional manner. The wafer is then reoxidized, as described in step 6, and the emitter is formed, as described in step 6. During the heating cycle for reoxidation and emitter formation, the gold plated on the backside diffuses into the wafer for a diffusion time in the order of 20 minutes at 1000°C, in accordance with conventional prior art practice. The transistor is then completed in the same manner, as described in step 7. Then, a comparison is made of the "pipe" densities in the transistor structure prepared in accordance with the present invention, and in the structure prepared by the prior art techniques. The structure prepared by the method of the present invention has a "pipe" density of $0.34 \times 10^3/cm^2$, while the structure prepared by the method of the prior art has a "pipe" density of $8.0 \times 10^3/cm^2$.

In this connection, it should be noted that copending application Ser. No. 539,007, entitled "Carrier Lifetime Killer Doping Process for Semiconductor Structures and the Product Formed Thereby," filed Mar. 31, 1966, in the names of Paul P. Castrucci et al., assigned to to the same assignee as the present application, offers a solution to the severe "piping" problem in planar transistors by a method which involves plating the gold on the backside of the wafer subsequent to the final oxidation step.

In order to compare the effect of the gold doping by the vapor diffusion method of the present invention with the gold doping by the improved gold doping from a solid source, as described in said copending application, a transistor is prepared by the method described in said copending application. The method of the copending application essentially involves the carrying out of steps 1 through 6, as described above, except that gold is not diffused simultaneously with the boron diffusion during the base fabrication step 5. After step 6, the entire wafer is reoxidized. Next, a portion of the oxide on the backside of the layer is removed and a layer of gold 200 units in thickness is plated on said exposed backside. The wafer is then heated in a nitrogen atmosphere for 20 minutes at 1,000°C to diffuse the gold into the wafer. The comparison of the wafer made by the post oxidation method of the copending application with the wafer prepared as described above in accordance with the vapor diffusion method of the present invention is found in the table below:

| Method | Transistor Parameters Pipe Density | Carrier Lifetime | Transistor Current Gain (β) |
|---|---|---|---|
| Post-oxidation Plating Method | $0.80 \times 10^3/cm^2$ | 7.5 to 8.0 Nano-sec. | 30 to 40 |
| Vapor Diffusion Present Method | $0.34 \times 10^3/cm^2$ | 4.1 to 7.4 Nano-Sec. | 24 to 67 |

The table indicates that the method of the present invention reduces "pipe" density even over the improved post oxidation gold plating method. Carrier lifetime is also reduced. In addition to these reductions, the method of the present invention has the advantage of eliminating the additional steps required for oxide removal by sand blasting, gold plating and heating, as well as a separate heating step in an inert atmosphere.

Figure 3A:
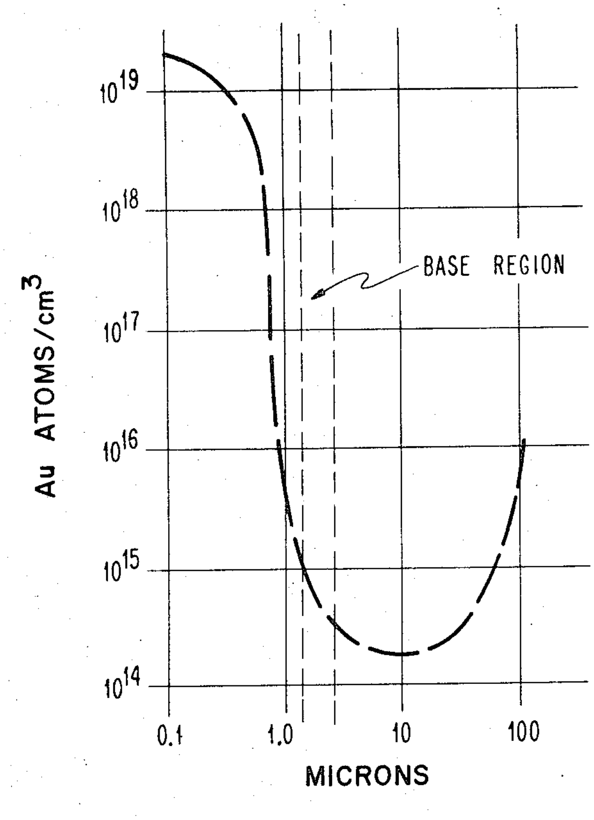
FIG. 3A is a graph illustrating a typical gold concentration profile within a planar transistor formed by the prior art backside diffusion method.
Figure 3B:
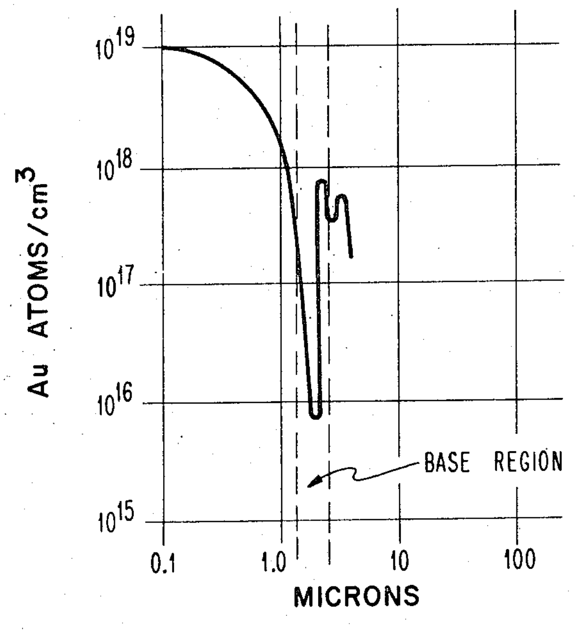
FIG. 3B is a graph illustrating the gold concentration profile within a planar transistor structure formed in accordance with the method of this invention.

The method described with respect to FIG. 1 produces a gold distribution or concentration profile in the planar transistor which is shown graphically in FIG. 3B. The graph is a logarithmic plot wherein the Y axis represents the concentration of gold in atoms/cm$^3$ and the X axis represents the distance from the surface of the planar transistor in the emitter region down through the intrinsic base region into the collector. For comparison, FIG. 3A is a graph of a similar plot of a typical gold distribution profile produced by any of the prior art methods which involve diffusion from a plated gold backside source. As indicated, none of the prior art methods was found to be capable of producing a similar concentration peak or significant increase in the base region or in the region proximate to the base-collector junction.

Figure 4A:
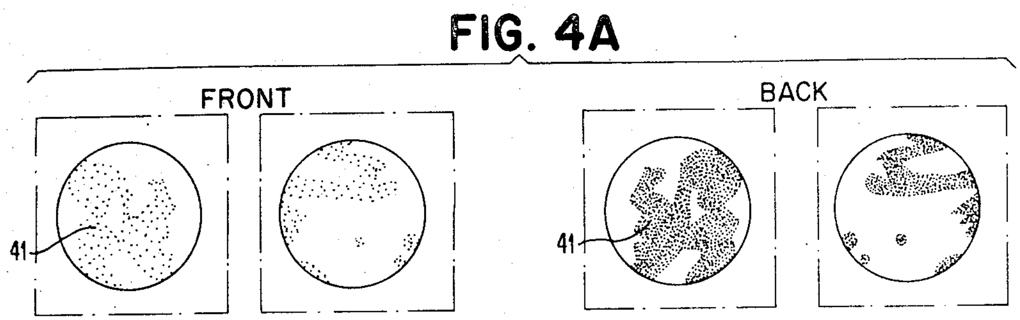
FIG. 4A and 4B are the autoradiograms of front and back sides of a series of wafers formed by standard methods and by methods in this invention comparing precipitated gold.

As previously mentioned, one of the primary advantages of the method of the present invention is that precipitation of gold within the planar transistor is minimized. This precipitated gold is believed to be one of the primary causes of "piping." In order to illustrate the minimal precipitation of gold using the method of the present invention, the following series of tests is made:

One pair of wafers is prepared by the best prior art method for reducing "piping," i.e., after the emitter diffusion step and reoxidation of the emitter opening, oxide on the backside of the wafer is removed and a layer of gold 250A, in thickness is plated. The wafer is then heated for 20 minutes at 1000°C in a nitrogen atmosphere, followed by an additional 2 hours at 560°C. In order to monitor the gold distribution, the gold diffused into the wafer is radioactive (neutron activated.) Then, to observe the resulting gold distribution both on the front side and on the backside of the wafer, autoradiograms of each side are prepared. This is done by placing either the front or the back surface of the wafer flat on a plate which is sensitive to radioactive materials, e.g., an x-ray plate, after the plated gold and gold-silicon alloy have been first etched away from the back surface. The reverse autoradiograms of both the front side and the backside of the pair of wafers are shown in FIG. 4A. It should be noted that the gold distribution is very irregular with extensive precipitation of gold which appear as regions 41 having varying degrees of brightness.

Figure 4B:
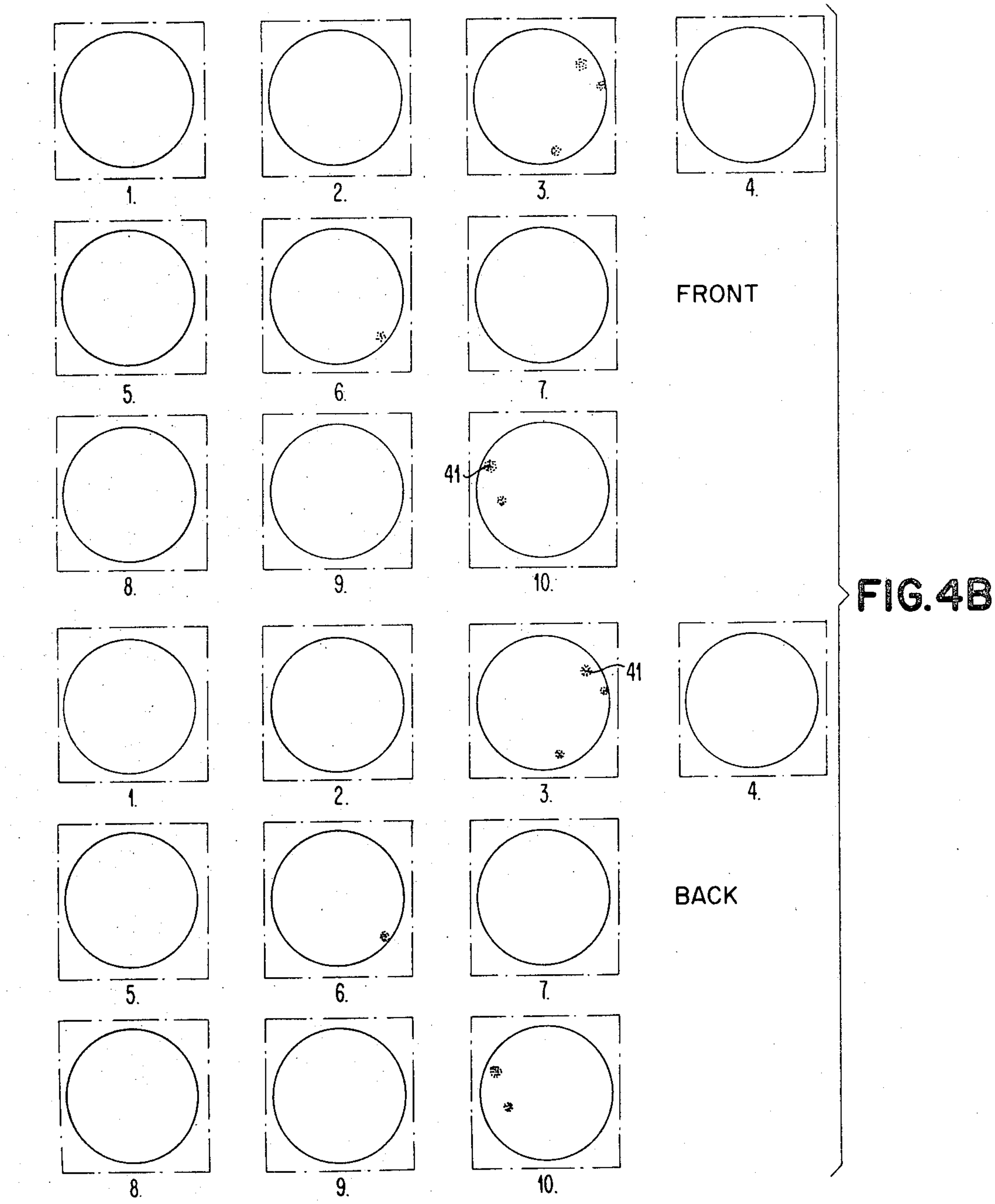

As a comparison, a series of planar transistor-containing wafers are prepared by the gold vapor diffusion method of the present invention. Here again, radioactive gold is used. The wafers 1, 2, 4, and 5 are prepared by the method described with respect to FIG. 1. Wafers 3 and 6 are prepared by a modification of the method of FIG. 1, wherein, in addition to the gold diffused simultaneously with the base diffusion, an additional quantity of gold is diffused into the wafer during the reoxidation and drive-in operation of step 6. During this step, the heating cycle is carried out in the presence of gold powder. Wafers 7 and 10 are prepared by another variation in the method of the present invention, wherein instead of simultaneously being diffused with the base in step 5, the gold is only diffused during the reoxidation of step 6. The transistors in wafers 8 and 9 are prepared by another variation of the method, wherein instead of gold being diffused simultaneously with the base in step 5, the gold is diffused during the final oxidation and emitter drive-in operation which follows step 6. The drive-in heat treatment is carried out in the presence of gold pellets and powder. The planar transistor wafers thus formed are applied to x-ray plates to form front and backside autoradiograms in the above-described manner. These reverse autoradiograms are shown in FIG. 4B.

A comparison of the autoradiograms prepared by the method of the present invention with the autoradiograms of the two wafers produced with standard techniques shows a marked reduction in precipitation of gold shown by a minimum of bright spots 41.

Thus, it may be seen that the reduction in precipitated gold and consequently, in "pipe" formation, does not have any strict dependence on the transistor fabrication step during which the gold is diffused into the wafer from the vapor state. Utilizing a vapor state diffusion into the front side of the planar transistor being formed minimizes "pipe" formation. As previously mentioned, the vapor phase diffusion method of the present invention permits a greater control over the gold being diffused than would prior art processes utilizing the infinite plated gold source on the backside of the wafer. By controlling temperatures, gold concentration in the vapor phase and heating times, it is possible to exercise control over the gold concentration profile within the planar transistor being formed. With the vapor phase method, the gold concentration may be controlled so that the concentration of gold at the diffusion surface of the wafer does not exceed the solid solubility of the gold in the semiconductor material forming the wafer. The maintenance of the concentration below the solid solubility is believed to be a significant factor in minimizing gold precipitation within the wafer.

While the vapor state diffusion of the present invention may be carried out utilizing an open-tube diffusion system to reduce "piping" in the transistors formed, best results in controlling the gold concentration are achieved using closed-tube diffusion. A planar transistor having a carrier lifetime killer concentration profile such as that of FIG. 3B, wherein there is a marked increase in gold proximate the collector-base junction, is most readily formed using a closed tube diffusion, particularly a closed-tube diffusion wherein the lifetime killers are diffused simultaneously with the base diffusion.

While the present invention has been illustrated primarily by the use of gold as the carrier lifetime killer, it should be understood that other carrier lifetime killers such as platinum and nickel may be utilized in place of gold.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A planar transistor doped with carrier lifetime killing atoms, said atoms distributed within said transistor extending from said emitter surface into said collector at concentration levels which first decrease with distance from said surface toward the base and then increase to a secondary peak in the vicinity of the base-collector junction.

2. The planar transistor of claim 1 wherein said atoms are gold.

3. The planar transistor of claim 2 wherein the concentration at said peak is at least one order of magnitude greater than the minimum level to which the concentration is first decreased.

4. The planar transistor of claim 2 wherein the concentration at said peak is at least one order of magnitude greater than the concentration at the emitter-base junction.

5. The planar transistor of claim 2 wherein said peak is in the collector region.

6. The planar transistor of claim 2 wherein said substrate is silicon.

7. The planar transistor of claim 6 wherein said emitter and base regions are formed within an epitaxial layer carried on a silicon support.

8. The planar transistor of claim 7 further including a low resistivity buried subcollector region of the same conductivity type as the epitaxial region formed in the surface of said silicon support beneath the emitter and intrinsic base regions.

* * * * *

PO-1050
(5/69)

UNITED STATES PATENT OFFICE
CERTIFICATE OF CORRECTION

Patent No. 3,728,592 Dated April 17, 1973

Inventor(s) Madhukar L. Joshi et al.

It is certified that error appears in the above-identified patent and that said Letters Patent are hereby corrected as shown below:

Column 1, Line 10 — after "lifetime", delete -- ! --.

Column 1, Line 21 — "of", first occurrence, should be -- or --.

Column 1, Line 34 — after "lifetime-killing", delete -- -killing --.

Column 3, Line 26 — "closed-type" should be -- closed-tube --.

Column 5, Line 28 — "0.5" should be -- 0.2 --.

Column 5, Line 33 — "not" should be -- now--.

Column 6, Line 35 — "$O_p$" should be -- $O_2$--.

Column 7, lines 1 and 39, after "200", each occurrence, insert -- A. --.

Signed and sealed this 12th day of February 1974.

(SEAL)
Attest:

EDWARD M.FLETCHER,JR.
Attesting Officer

C. MARSHALL DANN
Commissioner of Patents